US008810352B2

(12) United States Patent
Yokoyama et al.

(10) Patent No.: US 8,810,352 B2
(45) Date of Patent: Aug. 19, 2014

(54) LAMINATED INDUCTOR ELEMENT AND MANUFACTURING METHOD THEREOF

(71) Applicant: Murata Manufacturing Co., Ltd., Nagaokakyo (JP)

(72) Inventors: Tomoya Yokoyama, Nagaokakyo (JP); Takako Sato, Nagaokakyo (JP); Akihiro Ieda, Nagaokakyo (JP); Shigetoshi Hayashi, Nagaokakyo (JP); Hirokazu Yazaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/955,505

(22) Filed: Jul. 31, 2013

(65) Prior Publication Data

US 2013/0314190 A1 Nov. 28, 2013

Related U.S. Application Data

(63) Continuation of application No. PCT/JP2011/076985, filed on Nov. 24, 2011.

(30) Foreign Application Priority Data

Apr. 11, 2011 (JP) ................................ 2011-086899

(51) Int. Cl.
*H01F 5/00* (2006.01)
*H01F 27/29* (2006.01)
*H01L 23/12* (2006.01)
*H01F 41/04* (2006.01)
*H01F 17/00* (2006.01)
*H01F 3/14* (2006.01)

(52) U.S. Cl.
CPC ................ *H01F 27/29* (2013.01); *H01F 41/04* (2013.01); *H01F 27/292* (2013.01); *H01F 3/14* (2013.01); *H01F 41/046* (2013.01); *H01F 17/0033* (2013.01)
USPC ............................ 336/200; 336/192; 257/700

(58) Field of Classification Search
CPC ............ H01F 17/0013; H01F 17/0006; H01F 2017/002; H01F 27/29; H01L 23/49822; H01L 23/645; H01L 2924/14; H05K 2201/083; H05K 3/4092; H05K 3/4629
USPC .................. 336/192, 199, 200; 257/531, 700
See application file for complete search history.

(56) References Cited

U.S. PATENT DOCUMENTS 6,265,090 B1 * 7/2001 Nishide et al. ................ 428/701
6,426,551 B1 * 7/2002 Kawakami et al. ........... 257/700

(Continued)

FOREIGN PATENT DOCUMENTS

JP 07-86754 A 3/1995
JP 2005-183890 A 7/2005

(Continued)

OTHER PUBLICATIONS

Official Communication issued in International Patent Application No. PCT/JP2011/076985, mailed on Feb. 28, 2012.

(Continued)

*Primary Examiner* — Alexander Talpalatski
*Assistant Examiner* — Joselito Baisa
(74) *Attorney, Agent, or Firm* — Keating & Bennett, LLP

(57) ABSTRACT

In a laminated inductor element, outer electrodes and terminal electrodes are electrically connected by via holes, internal wiring lines, and end surface electrodes. The via holes on an upper surface side are provided immediately under the outer electrodes and in a non-magnetic ferrite layer. The via holes on a lower surface side are provided immediately above the terminal electrodes and in a non-magnetic ferrite layer. Since outermost layers are defined by the non-magnetic ferrite layers, a parasitic inductance is not increased, even if the outermost layers are provided with the via holes. In this case, the internal wiring lines are not routed on a surface of the element. Therefore, there is no complication of a wiring pattern, and it is possible to prevent an increase in a mounting area of the element.

20 Claims, 7 Drawing Sheets

(56) References Cited

U.S. PATENT DOCUMENTS

| | | | | |
|---|---|---|---|---|
| 6,459,351 | B1 * | 10/2002 | Maki et al. | 336/200 |
| 6,784,765 | B2 * | 8/2004 | Yamada et al. | 333/193 |
| 6,812,561 | B2 * | 11/2004 | Matsuta | 257/700 |
| 6,956,455 | B2 * | 10/2005 | Tokuda et al. | 336/83 |
| 7,839,651 | B2 * | 11/2010 | Nishizawa | 361/763 |
| 2009/0068426 | A1 | 3/2009 | Nishizawa | |
| 2009/0201005 | A1 | 8/2009 | Noma et al. | |
| 2010/0328010 | A1 | 12/2010 | Noma et al. | |

FOREIGN PATENT DOCUMENTS

| | | | |
|---|---|---|---|
| JP | 2007-266245 | A | 10/2007 |
| WO | 2007/145189 | A1 | 12/2007 |
| WO | 2008/087781 | A1 | 7/2008 |

OTHER PUBLICATIONS

Sato, “Laminated Inductor Element and Manufacturing Method Thereof”, U.S. Appl. No. 13/955,488, filed Jul. 31, 2013.

* cited by examiner

FORM THROUGH HOLES

FILL HOLES WITH CONDUCTIVE PASTE

OPEN HOLES IN PERPENDICULAR DIRECTION

BREAK LAMINATE

LAMINATED INDUCTOR ELEMENT AND MANUFACTURING METHOD THEREOF

BACKGROUND OF THE INVENTION

1. Field of the Invention

The present invention relates to a laminated inductor element defined by a lamination of a plurality of sheets including a magnetic material and including coil patterns located thereon, and to a manufacturing method thereof.

2. Description of the Related Art

In the past, a laminated element having a plurality of laminated sheets has been known. For example, International Publication No. 2007/145189 discloses a laminated inductor element having a magnetic material formed with coil patterns and laminated. The laminated inductor element of International Publication No. 2007/145189 has a non-magnetic material disposed on outermost layers and in an intermediate layer to improve a direct-current superimposition characteristic of an inductor.

However, in a configuration in which via holes are formed to electrically connect mounting electrodes formed on respective surfaces of the outermost layers, and the mounting electrodes are connected through the magnetic material, a parasitic inductance is increased. Therefore, a configuration electrically connecting upper and lower surfaces via an end surface electrode, as in International Publication No. 2008/87781, for example, is conceivable.

To electrically connect the upper and lower surfaces via the end surface electrode, however, it is necessary to route a wiring pattern on a surface of the laminated element. Therefore, issues of complication of the wiring pattern and an increase in mounting area of the element arise.

SUMMARY OF THE INVENTION

In view of the above, preferred embodiments of the present invention provide a laminated inductor element and a manufacturing method thereof which significantly reduce parasitic inductance while preventing complication of the wiring pattern and an increase in mounting area of the element.

A laminated inductor element according to a preferred embodiment of the present invention includes a magnetic layer defined by lamination of a plurality of magnetic sheets, a non-magnetic layer defined by lamination of a plurality of non-magnetic sheets and disposed on outermost layers and in an intermediate layer of the body of the element, and an inductor including coils provided between the laminated sheets and connected in a lamination direction.

Further, a laminated inductor element according to a preferred embodiment of the present invention includes a via hole provided in the non-magnetic layer on each of the outermost layers, an end surface electrode provided on an end surface of the body of the element, a plurality of mounting electrodes located on respective surfaces of the outermost layers of the body of the element, and an internal wiring line configured to electrically connect the via hole and the end surface electrode, and at least some of the mounting electrodes are electrically connected to the end surface electrode by the via hole and the internal wiring line.

Further, more preferably, a laminated inductor element according to a preferred embodiment of the present invention is such that the internal wiring line is disposed at a boundary surface between the non-magnetic layers on one of the outermost layers and the magnetic layer in contact with the non-magnetic layer.

Even if the non-magnetic layer on each of the outermost layers is provided with the via hole, a parasitic inductance is not increased. Therefore, the mounting electrode is electrically connected, through the via hole provided in the non-magnetic layer on the corresponding outermost layer, to the internal wiring line disposed at the boundary surface with the magnetic layer immediately under the mounting electrode. Further, the mounting electrode is connected to the end surface electrode via the internal wiring line at the boundary surface. As a result, the mounting electrodes provided on the upper and lower surfaces are electrically connected. That is, the mounting electrodes are connected by the via hole only in the non-magnetic layer, and are connected not by the via hole but by the end surface electrode in the magnetic layer. It is thus possible to reduce the parasitic inductance. In this case, the internal wiring line is not routed on a surface of the element. Therefore, there is no complication of a wiring pattern, and it is possible to prevent an increase in a mounting area of the element.

The magnetic layer and the non-magnetic layer in the laminated inductor element according to a preferred embodiment of the present invention are formed by simultaneous firing. That is, according to the configuration, the layers are provided not by, for example, firing only the magnetic material and thereafter applying the non-magnetic layer to the outermost layers, but by laminating sheets previously formed with the internal wiring line and thereafter firing the layers at the same time.

According to various preferred embodiments of the present invention, it is possible to significantly reduce the parasitic inductance while preventing any increase in mounting area of the element and the complication of the wiring pattern.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
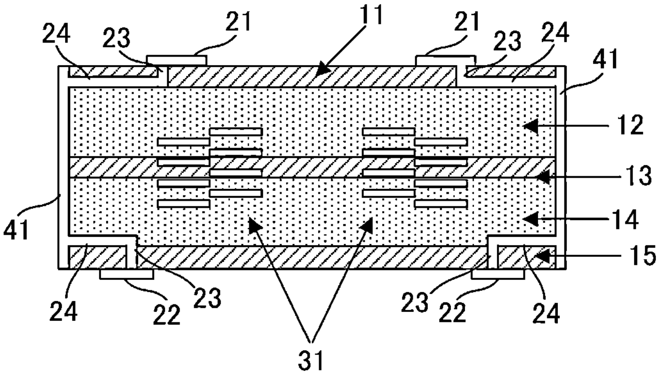
FIGS. 1A and 1B are cross-sectional views of a laminated inductor element.
Figure 1B:
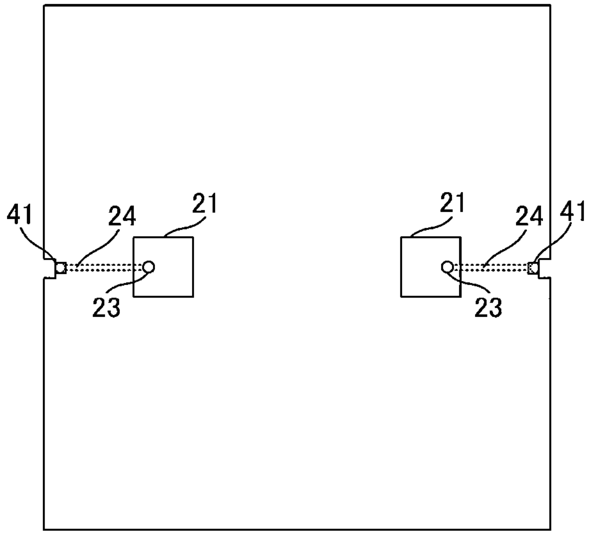

FIG. 1A is a cross-sectional view of a laminated inductor element according to a preferred embodiment of the present invention, and FIG. 1B is a top view of the laminated inductor element. The laminated inductor element is defined by a lamination of magnetic ceramic green sheets and non-magnetic ceramic green sheets. In the cross-sectional view illustrated in the present preferred embodiment, the upper side of the drawing corresponds to the upper surface side of the laminated inductor element, and the lower side of the drawing corresponds to the lower surface side of the laminated inductor element.

The laminated inductor element in the example of FIGS. 1A and 1B includes a laminate including a non-magnetic ferrite layer 11, a magnetic ferrite layer 12, a non-magnetic ferrite layer 13, a magnetic ferrite layer 14, and a non-magnetic ferrite layer 15 sequentially disposed from an outermost layer on the upper surface side toward an outermost layer on the lower surface side.

On some of the ceramic green sheets of the laminate, internal electrodes including coil patterns are provided. The coil patterns are connected in the lamination direction to define an inductor 31. The inductor 31 in the example of FIG. 1A is disposed in the magnetic ferrite layer 12 on the upper surface side, the non-magnetic ferrite layer 13 corresponding to an intermediate layer, and the magnetic ferrite layer 14 on the lower surface side.

On the upper surface of the non-magnetic ferrite layer (the uppermost surface of the element), outer electrodes 21 are provided. The outer electrodes 21 are mounting electrodes to be mounted with an IC, a capacitor, and so forth. Mounted with various semiconductor devices and passive elements, an electronic component module (such as a DC-DC converter, for example) including the laminated inductor element is configured. Although two outer electrodes 21 are illustrated in the present preferred embodiment for the purpose of explanation, an actual element preferably includes a larger number of outer electrodes.

Further, the lower surface of the non-magnetic ferrite layer 15 (the lowermost surface of the element) includes terminal electrodes 22. The terminal electrodes 22 serve as mounting electrodes to be connected to land electrodes or the like of a mounting substrate which is mounted with the electronic component module in an electronic device product manufacturing process after the shipment of the laminated inductor element as the electronic component module.

The non-magnetic ferrite layer 13 corresponding to an intermediate layer functions as a gap between the magnetic ferrite layer 12 and the magnetic ferrite layer 14, and improves a direct-current superimposition characteristic of the inductor 31.

The non-magnetic ferrite layer 11 and the non-magnetic ferrite layer 15 corresponding to the outermost layers cover the upper surface of the magnetic ferrite layer 12 and the lower surface of the magnetic ferrite layer 14, respectively, and prevent an unintended short circuit due to a later-described diffused metal component.

Further, the non-magnetic ferrite layer 11 and the non-magnetic ferrite layer 15 of the present preferred embodiment are lower in thermal shrinkage rate than the magnetic ferrite layer 12 and the magnetic ferrite layer 14. If the magnetic ferrite layer 12 and the magnetic ferrite layer 14 having a relatively high thermal shrinkage rate are sandwiched by the non-magnetic ferrite layer 11 and the non-magnetic ferrite layer 15 having a relatively low thermal shrinkage rate, therefore, it is possible to compress the entire element and improve the strength thereof by firing.

The outer electrodes 21 and the terminal electrodes 22 are electrically connected by via holes 23, internal wiring lines 24, and end surface electrodes 41. The via holes 23 on the upper surface side are provided immediately under the outer electrodes 21 and in the non-magnetic ferrite layer 11. The via holes 23 on the lower surface side are provided immediately above the terminal electrodes 22 and in the non-magnetic ferrite layer 15.

The via holes 23 are formed preferably by laminating the ceramic green sheets of the non-magnetic ferrite layer 11 and the non-magnetic ferrite layer 15 and thereafter punching the ceramic green sheets with a punch or the like, or by punching each of the ceramic green sheets to be formed into the non-magnetic ferrite layer 11 and the non-magnetic ferrite layer 15 and thereafter laminating the non-magnetic ferrite layers. The shape of the holes is not limited to the circular or substantially circular shape, and may be another shape, such as a rectangular shape or rectangular shape, for example.

As indicated by the cross-sectional view in FIG. 1A and broken lines in the top view in FIG. 1B, the internal wiring lines 24 are disposed to connect the via holes 23 and the end surface electrodes 41. In FIG. 1A, it appears as if the internal wiring lines 24 on the upper surface side and the internal wiring lines 24 on the lower surface side are disposed in the non-magnetic ferrite layer 11 and the magnetic ferrite layer 14, respectively. In fact, however, the internal wiring lines 24 on the upper surface side are printed on the uppermost ceramic green sheet of the magnetic ferrite layer 12, and the internal wiring lines 24 on the lower surface side are printed on the uppermost ceramic green sheet of the non-magnetic ferrite layer 15. Therefore, each of the internal wiring lines 24 is disposed at a boundary surface between the non-magnetic layer of one of the outermost layers and the magnetic layer in contact with the non-magnetic layer. The internal wiring line 24, however, is not required to be disposed at the boundary surface, and may be disposed on one of the ceramic green sheets in the non-magnetic ferrite layer.

Each of the end surface electrodes 41 preferably is a rectangular or substantially rectangular via hole provided in a portion of a side wall of a through hole provided in an end surface of the body of the element. As a preferred embodiment, the end surface electrodes 41 may be formed preferably by laminating all of the ceramic green sheets and thereafter punching the ceramic green sheets with a punch or the like. Further, as another preferred embodiment, the end surface electrodes 41 may be formed by punching each of the ceramic green sheets with a punch or the like and thereafter laminating the ceramic green sheets. The shape of the via hole is not limited to the rectangular or substantially rectangular shape, and may be another shape, such as a semicircular or substantially semicircular shape. Further, the present preferred embodiment is not limited to that having the via hole provided in a portion of the side wall of the through hole, and may be configured such that an end surface of the via hole is directly exposed to the side surface of the element.

With the above-described configuration, the outer electrodes 21 and the terminal electrodes 22 are electrically connected via the end surface electrodes 41, without passing through the magnetic ferrite layers. Further, the internal wiring lines 24 are not exposed to the respective surfaces of the non-magnetic ferrite layer 11 and the non-magnetic ferrite layer 15 corresponding to the outermost layers. Therefore, a wiring pattern is not routed on a surface of the body of the element, regardless of the type of the wiring pattern to be formed, and it is possible to prevent an increase in area of the element.

Figure 2:
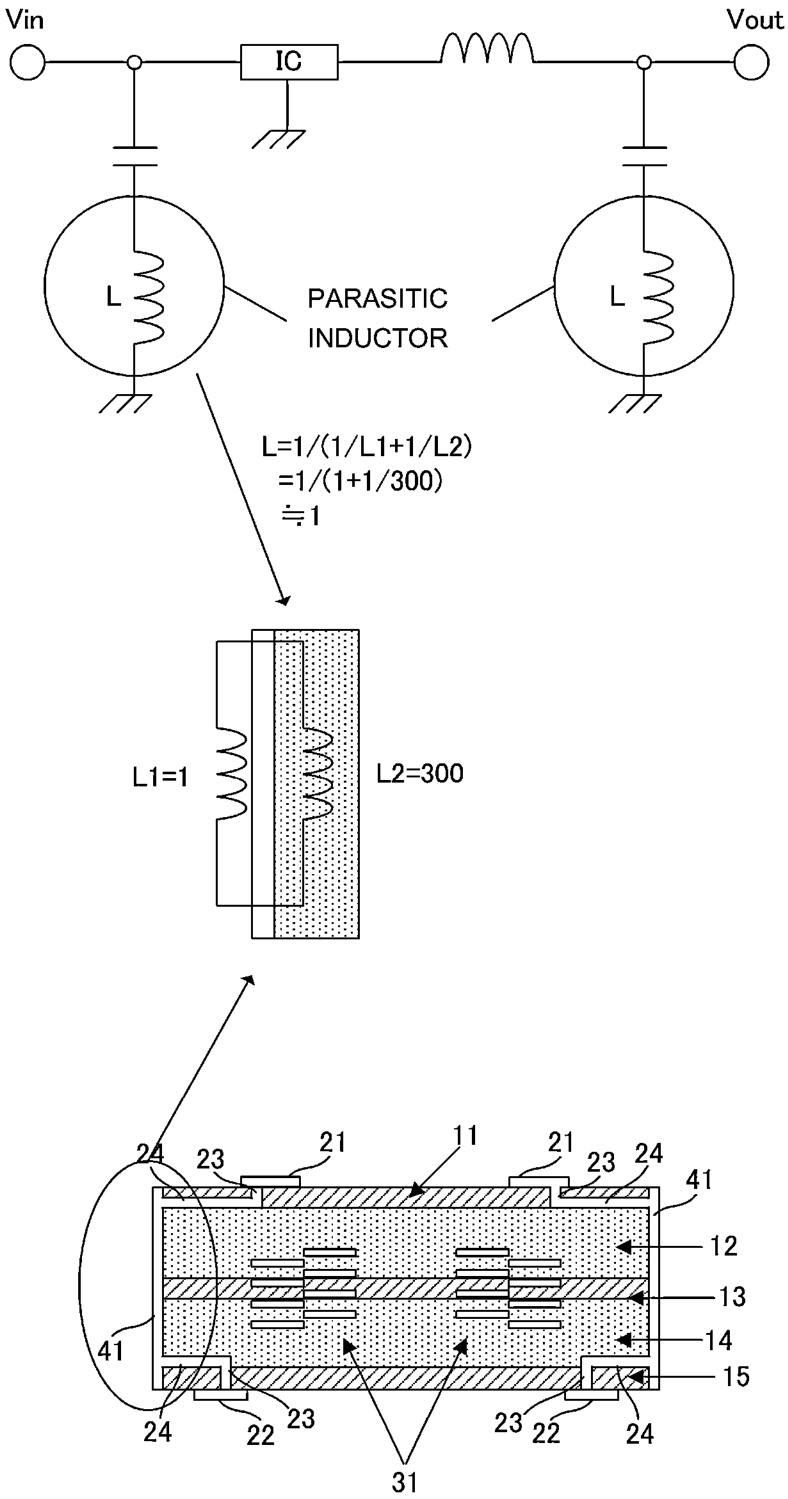
FIG. 2 is an equivalent circuit diagram of a DC-DC converter and conceptual diagrams of a parasitic inductance.

Subsequently, operational effects of the end surface electrodes 41 will be described. FIG. 2 is an equivalent circuit diagram of the laminated inductor element configured as a DC-DC converter and conceptual diagrams of a parasitic inductance.

In general, a wiring line disposed on a magnetic ferrite layer acts as a parasitic inductor, as illustrated in an equivalent circuit of FIG. 2. If the outer electrodes 21 and the terminal electrodes 22 are electrically connected by via holes, the parasitic inductor has a significantly high inductance.

A switching signal of the DC-DC converter preferably is a high-frequency signal usually ranging from about 100 kHz to about 6 MHz, for example. The parasitic inductance in a high-frequency range acts as high resistance, and thus the switching signal does not flow into the ground and appears as noise. Further, a ripple component is superimposed on the output voltage, and the stability of the output voltage is compromised.

If the electrodes are connected via the end surface electrodes 41 to open a portion of wiring lines passing the magnetic ferrite layers, however, the influence of the parasitic inductor is negligible, as described below. That is, the parasitic inductance in each of the end surface electrodes 41 is representable as a combined inductance of two parallel-connected inductors. When the respective inductances of the parallel-connected inductors are represented as L1 and L2, the combined inductance L is represented as $L=1/(1/L1+1/L2)$. Herein, the inductance L1 corresponds to a relative permeability $\mu=1$, and $L1=1$ holds. Therefore, when the inductance L2 is $L2=300$ (relative permeability $\mu=300$), for example, the combined inductance L is represented as $L=1/(1/1+1/300)\approx1$. Therefore, the influence of the parasitic inductance is substantially negligible.

Figure 3A:
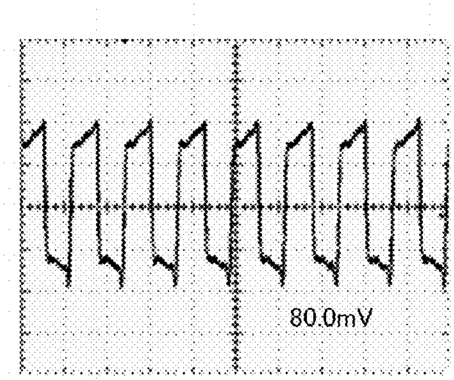
FIGS. 3A-3D are comparative diagrams of ripple voltage and spike voltage at an output current of 100 mA.
Figure 3B:
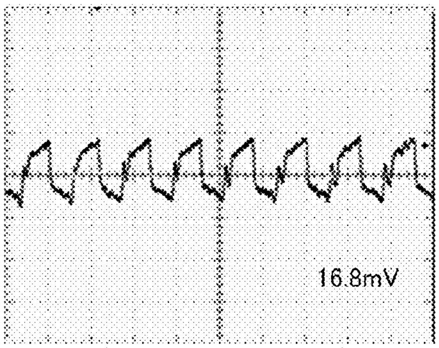

FIGS. 3A-3D are comparative diagrams of ripple voltage and spike voltage at an output current of about 100 mA. FIGS. 4A-4D are comparative diagrams of ripple voltage and spike voltage at an output current of about 600 mA. FIG. 3A and FIG. 4A illustrate the ripple voltage in a case where the outer electrodes 21 and the terminal electrodes 22 are electrically connected by via holes, and FIG. 3B and FIG. 4B illustrate the ripple voltage in a case where the outer electrodes 21 and the terminal electrodes 22 are connected by the end surface electrodes 41. As illustrated in FIG. 3A and FIG. 3B, improvement from about 80.0 mV to about 16.8 mV is observed in the ripple voltage at about 100 mA, for example. As illustrated in FIG. 4A and FIG. 4B, improvement from about 174.0 mV to about 28.0 mV is observed in the ripple voltage at about 600 mA, for example.

Figure 3C:
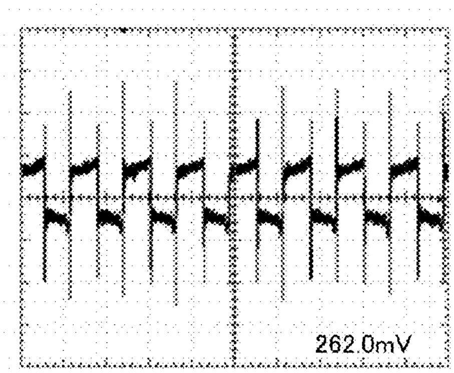
Figure 3D:
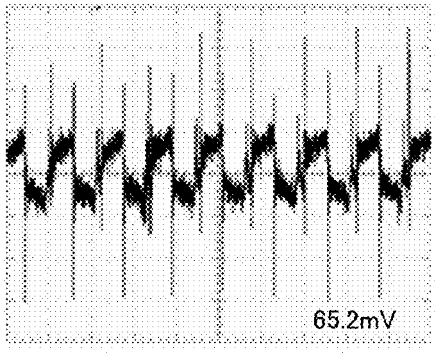
Figure 4A:
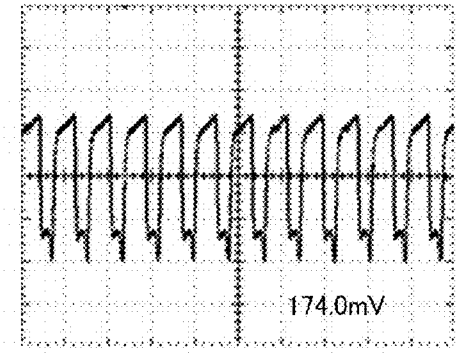
FIGS. 4A-4D are comparative diagrams of ripple voltage and spike voltage at an output current of 600 mA.
Figure 4B:
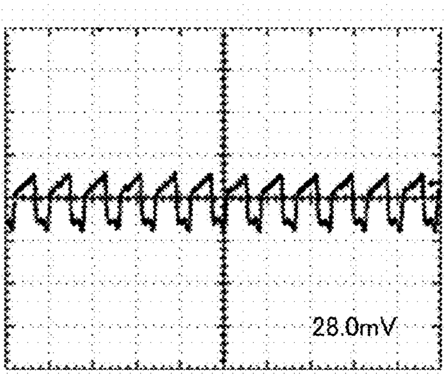
Figure 4C:
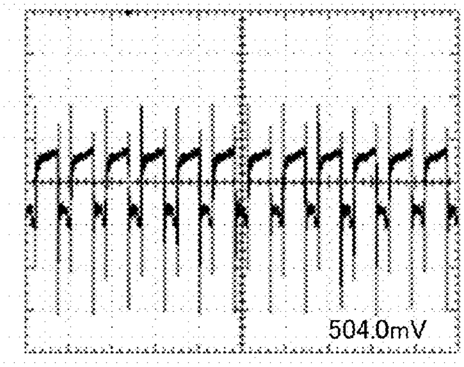
Figure 4D:
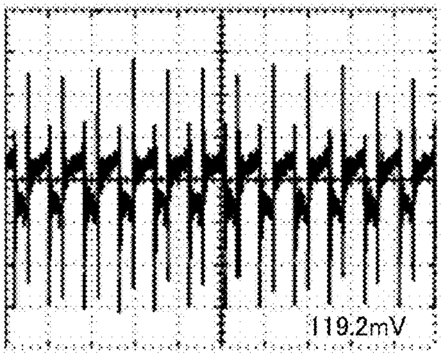

Further, FIG. 3C and FIG. 4C illustrate the spike voltage in the case where the outer electrodes 21 and the terminal electrodes 22 are electrically connected by via holes, and FIG. 3D and FIG. 4D illustrate the spike voltage in the case where the outer electrodes 21 and the terminal electrodes 22 are connected by the end surface electrodes 41. As illustrated in FIG. 3C and FIG. 3D, improvement from about 262.0 mV to about 65.2 mV is also observed in the spike voltage at about 100 mA, for example. As illustrated in FIG. 4D and FIG. 4D, improvement from about 504.0 mV to about 119.2 mV is also observed in the spike voltage at about 600 mA, for example.

Figure 5:
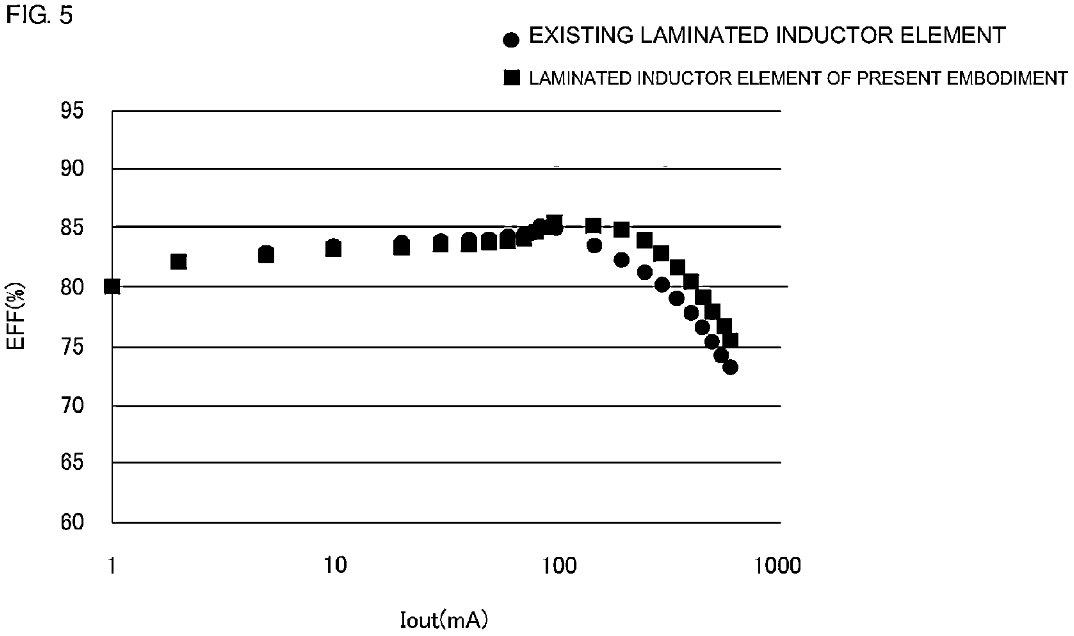
FIG. 5 is a comparative diagram of voltage conversion efficiency.

Further, FIG. 5 is a comparative diagram of voltage conversion efficiency. As illustrated in FIG. 5, it is understood that, particularly in a high load range, the voltage conversion efficiency is higher in the case where the outer electrodes 21 and the terminal electrodes 22 are connected by the end surface electrodes 41 than in the case where the outer electrodes 21 and the terminal electrodes 22 are electrically connected by via holes.

Figure 6A:
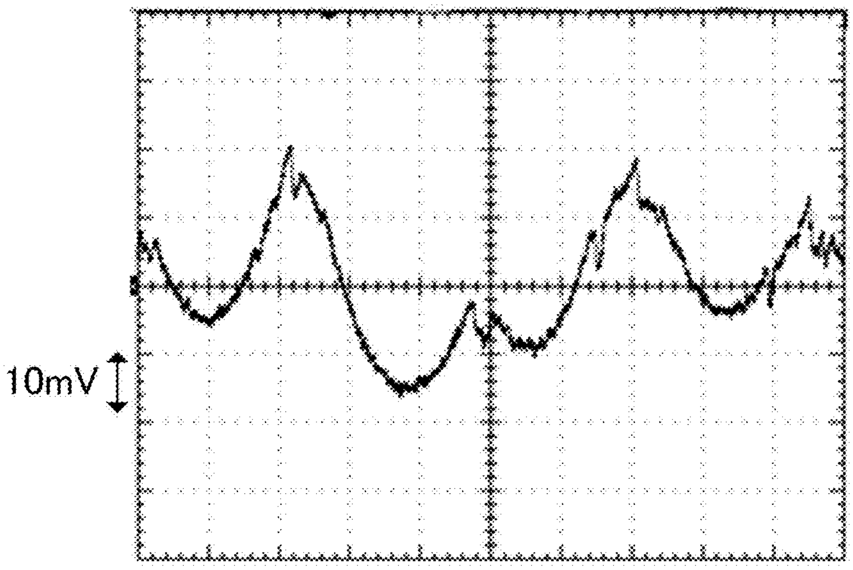
FIGS. 6A and 6B are comparative diagrams of ripple voltage under a specific condition.
Figure 6B:
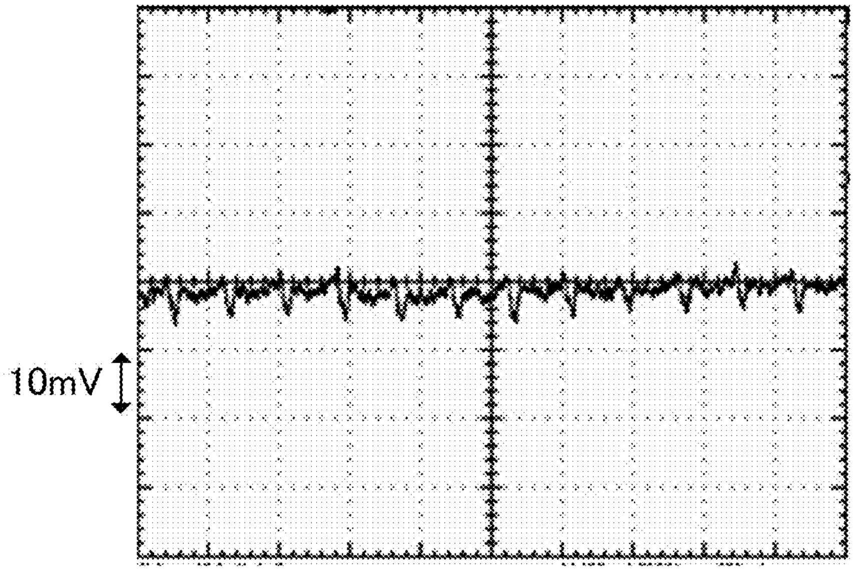

Further, FIGS. 6A and 6B are diagrams of comparison of the ripple voltage in a case where the output voltage and the output current are high (Vin=4.4 V, Vout=3.3 V, and Iout=650 mA) as a specific condition. As illustrated in FIG. 6A, if the parasitic inductance is increased, the switching signal makes the ground potential of the IC unstable, and the IC fails to stably operate in some cases. Meanwhile, as illustrated in FIG. 6B, it is understood that the IC stably operates in the case where the outer electrodes 21 and the terminal electrodes 22 are connected by the end surface electrodes 41.

Subsequently, description will be made of a non-limiting example of a process of manufacturing the laminated inductor element of the present preferred embodiment. The laminated inductor element is manufactured by the following process, for example.

An alloy (a conductive paste) containing Ag and so forth is first applied onto each of the ceramic green sheets to be formed into the magnetic ferrite layers and the non-magnetic ferrite layers, and the inductor 31 (coil patterns) and the internal wiring lines 24 are formed. If the via holes 23 and the end surface electrodes 41 are formed before lamination, the formation is performed before or after the application process. In this case, if the process is configured to perform, on each of the sheets, the application of the conductive paste to the holes formed by a punch or the like and then open holes again with a punch or the like, it is possible to make the alloy cover the entire surface as the via holes 23 and the end surface electrodes 41 after the lamination.

Figure 7A:
FIGS. 7A-7D are diagrams illustrating a process of manufacturing end surface electrodes.
Figure 7B:
Figure 7C:
Figure 7D:
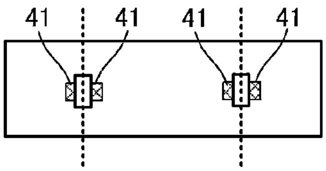

Then, the ceramic green sheets are laminated. That is, a plurality of ceramic green sheets to be formed into the non-magnetic ferrite layer 15, a plurality of ceramic green sheets to be formed into the magnetic ferrite layer 14, a plurality of ceramic green sheets to be formed into the non-magnetic ferrite layer 13, a plurality of ceramic green sheets to be formed into the magnetic ferrite layer 12, and a plurality of ceramic green sheets to be formed into the non-magnetic ferrite layer 11 are sequentially laminated from the lower surface side, and are subjected to temporary pressure-bonding. As a result, a pre-firing mother laminate is formed. If the via holes 23 are formed after the lamination, the non-magnetic ferrite layer 11 and the non-magnetic ferrite layer 15 are laminated, and holes are opened in the layers with a punch or the like. Thereafter, the holes are filled with the conductive paste. If the end surface electrodes 41 are formed after the lamination, all of the ceramic green sheets are laminated, and thereafter rectangular or substantially rectangular holes are opened in the sheets with a punch or the like, as illustrated in FIG. 7A. Then, the holes are filled with the conductive paste, as illustrated in FIG. 7B. Thereafter, as illustrated in FIG. 7C, further rectangular or substantially rectangular holes are opened in the sheets with a punch or the like in a different direction from (a perpendicular or substantially perpendicular direction to) the direction of the previously opened rectangular or substantially rectangular punched holes. The rectangular or substantially rectangular holes opened in the different direction serve as through holes, and the initially opened rectangular or substantially rectangular holes (those filled with the conductive paste) serve as the end surface electrodes 41. Then, the mother laminate is broken apart, as illustrated in FIG. 7D. As a result, each of the end surface electrodes 41 is disposed in a portion of a side wall of the corresponding through hole. In this case, the via holes 23 and the end surface electrodes 41 are surface-coated by a later-described plating process, and thus have an electrically conductive structure.

Then, an electrode paste containing silver as a main component is applied to surfaces of the formed mother laminate, and the outer electrodes 21 and the terminal electrodes 22 are formed.

Thereafter, grooves for breaking are formed by a dicing process to make the mother laminate breakable in a predetermined size.

Then, firing is performed. As a result, a mother laminate having the magnetic ferrite layers and the non-magnetic ferrite layers simultaneously fired (pre-break laminated inductor elements) is obtained.

Then, finally, respective surfaces of the outer electrodes of the mother laminate are plated. The plating process is performed by immersing and swinging the mother laminate in a plating solution.

The thus-manufactured laminated inductor element serves as an electronic component module, when mounted with electronic components, such as an IC and a capacitor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated inductor element comprising:

- a magnetic layer defined by a lamination of a plurality of magnetic sheets;
- a non-magnetic layer defined by a lamination of a plurality of non-magnetic sheets, and disposed on outermost layers and in an intermediate layer of the laminated inductor element;
- an inductor including coils provided between the laminated sheets and connected in a lamination direction;
- a via hole provided in the non-magnetic layer on each of the outermost layers;
- an end surface electrode provided on an end surface of the laminated inductor element;
- a plurality of mounting electrodes located on respective surfaces of the outermost layers; and
- an internal wiring line configured to electrically connect the via hole and the end surface electrode; wherein
- the plurality of mounting electrodes includes a plurality of outer electrodes located on a principal surface of one of the outermost layers and electrically connected to semiconductor devices or passive elements mounted thereon, and a plurality of terminal electrodes located on a principal surface of another of the outermost layers and electrically connected to an outer mounting substrate; and
- at least some of the plurality of outer electrodes are electrically connected to the plurality of terminal electrodes through the via hole, the internal wiring line, and the end surface electrode, such that an electrical connection through the via hole does not pass through the magnetic layer.

2. The laminated inductor element described in claim 1, wherein the internal wiring line is disposed at a boundary surface between the non-magnetic layer on one of the outermost layers and the magnetic layer in contact with the non-magnetic layer.

3. The laminated inductor element described in claim 1, wherein the magnetic layer and the non-magnetic layer are simultaneously fired layers.

4. The laminated inductor element described in claim 1, further comprising a plurality of the magnetic layer and a plurality of the non-magnetic layer.

5. The laminated inductor element described in claim 4, wherein the magnetic layers and the non-magnetic layers are sequentially disposed from the outermost layer on an upper surface side toward the outermost layer on a lower surface side in an order of a first non-magnetic layer, a first magnetic layer, a second non-magnetic layer, a second magnetic layer, and a third non-magnetic layer.

6. The laminated inductor element described in claim 5, wherein the second non-magnetic layer defines a gap between the first magnetic layer and the second magnetic layer.

7. The laminated inductor element described in claim 5, wherein the first non-magnetic layer and the third non-magnetic layer are lower in thermal shrinkage rate than the first magnetic layer and the second magnetic layer.

8. The laminated inductor element described in claim 5, further comprising a plurality of the internal wiring line, wherein a first group of the internal wiring lines are located on an uppermost magnetic sheet of the first magnetic layer and a second group of the internal wiring lines are located on an uppermost non-magnetic sheet of the third non-magnetic layer.

9. The laminated inductor element described in claim 8, wherein the internal wiring lines are not exposed to respective surfaces of the first non-magnetic layer and the third non-magnetic layer.

10. The laminated inductor element described in claim 1, wherein the outer electrodes and the terminal electrodes are electrically connected by the end surface electrode without passing through the magnetic layer.

11. A manufacturing method of a laminated inductor element, the method comprising:

- a step of forming coil patterns and an internal wiring line on a plurality of layers including magnetic sheets;
- a step of laminating the layers to form a laminate, disposing on outermost layers and in an intermediate layer of the laminate a non-magnetic layer formed by a lamination of non-magnetic sheets, and connecting the coil patterns in a lamination direction to form an inductor;
- a step of forming a via hole in the non-magnetic layer on each of the outermost layers;
- a step of forming an end surface electrode on an end surface of the laminated inductor element; and
- a step of forming a plurality of mounting electrodes on respective surfaces of the outermost layers; wherein
- the step of forming the plurality of mounting electrodes includes a step of forming a plurality of outer electrodes on a principal surface of one of the outermost layers and electrically connected to semiconductor devices or passive elements mounted thereon, and a step of forming a plurality of terminal electrodes on a principal surface of another of the outermost layers and electrically connected to an outer mounting substrate;
- the internal wiring line is formed to electrically connect the via hole and the end surface electrode; and
- at least some of the plurality of outer electrodes are electrically connected to the plurality of terminal electrodes by the via hole, the internal wiring line, and the end surface electrode, such that an electrical connection through the via hole does not pass through the magnetic layer.

12. The method described in claim 11, wherein the internal wiring line is disposed at a boundary surface between the non-magnetic layer on one of the outermost layers and a magnetic layer in contact with the non-magnetic layer.

13. The method described in claim 11, further comprising a step of forming the magnetic layer and the non-magnetic layer by simultaneous firing.

14. The method described in claim 11, further comprising a plurality of the magnetic layer and a plurality of the non-magnetic layer.

15. The method described in claim 11, wherein the magnetic layers and the non-magnetic layers are sequentially disposed from the outermost layer on an upper surface side toward the outermost layer on a lower surface side in an order of a first non-magnetic layer, a first magnetic layer, a second non-magnetic layer, a second magnetic layer, and a third non-magnetic layer.

16. The method described in claim 15, wherein the second non-magnetic layer defines a gap between the first magnetic layer and the second magnetic layer.

17. The method described in claim 15, wherein the first non-magnetic layer and the third non-magnetic layer are lower in thermal shrinkage rate than the first magnetic layer and the second magnetic layer.

18. The method described in claim 15, further comprising a plurality of the internal wiring line, wherein a first group of the internal wiring lines are located on an uppermost magnetic sheet of the first magnetic layer and a second group of the internal wiring lines are located on an uppermost non-magnetic sheet of the third non-magnetic layer.

19. The method described in claim 18, wherein the internal wiring lines are not exposed to respective surfaces of the first non-magnetic layer and the third non-magnetic layer.

20. The method described in claim 11, wherein the outer electrodes and the terminal electrodes are electrically connected by the end surface electrode without passing through the magnetic layer.

* * * * *